United States Patent [19]
Borkar et al.

[11] Patent Number: 5,604,450
[45] Date of Patent: Feb. 18, 1997

[54] HIGH SPEED BIDIRECTIONAL SIGNALING SCHEME

[75] Inventors: Shekhar Borkar, Portland; Stephen R. Mooney, Beaverton; Charles E. Dike, Hillsboro, all of Oreg.

[73] Assignee: Intel Corporation, Santa Clara, Calif.

[21] Appl. No.: 508,159

[22] Filed: Jul. 27, 1995

[51] Int. Cl.[6] .................... H03K 19/0175; H03K 19/00
[52] U.S. Cl. ........................... 326/82; 326/30; 326/86; 326/60
[58] Field of Search ................... 326/30, 86, 82–83, 326/59–60, 90, 91

[56] References Cited

U.S. PATENT DOCUMENTS

| | | | |
|---|---|---|---|
| 4,631,428 | 12/1986 | Grimes | 326/59 |
| 4,719,369 | 1/1988 | Asano et al. | 326/30 |
| 5,311,083 | 5/1994 | Wanlass | 326/30 |
| 5,438,281 | 8/1995 | Takahashi et al. | 326/30 |
| 5,457,407 | 10/1995 | Shu et al. | 326/30 |
| 5,514,983 | 5/1996 | Yoshino | 326/30 |

*Primary Examiner*—Edward P. Westin
*Assistant Examiner*—Jon Santamauro
*Attorney, Agent, or Firm*—Blakely, Sokoloff, Taylor & Zafman

[57] ABSTRACT

In a computer system having multiple components, a bidirectional scheme which allows bidirectional data communications between components over a single wire without using termination resistors by placing two drivers from two corresponding processor cores on the same wire, and allowing simultaneous data transfer in two directions. This doubles the effective bandwidth per pin without requiring a modification to the clocking scheme of the system. The driver is impedance matched to the line, and used as the termination for the driver on the opposite end of the wire. This reduces the termination power, since no power is consumed when both drivers are in the same state. The bidirectional flow of data creates a ternary encoding, with a relatively simple decoding possible.

17 Claims, 5 Drawing Sheets

HIGH SPEED BIDIRECTIONAL SIGNALING SCHEME

FIELD OF THE INVENTION

The subject invention relates to communications between microprocessor integrated circuits (chips) in multi-processor systems.

BACKGROUND OF THE INVENTION

Prior art approaches to inter-chip communication utilize unidirectional signal flow on either a point to point interconnect, or a shared bus. For systems in which the electrical length of the interconnect is significant in relation to the edge rate or fundamental frequency of the signals traversing them, and operation at the highest possible speeds is desired, the interconnect medium consists of controlled impedance traces terminated in their characteristic impedance. The goal of these interconnect designs is to obtain the optimum combination of bandwidth, number of wires, power, and cost. The prior art schemes require many wires (e.g., one per signal plus an additional wire for each bidirectional signal) with their corresponding termination resistors in order to achieve the highest possible bandwidth. The termination resistors are used to prevent signal reflection back to the sender, reducing the amount of noise present on the wire.

Current and next generation supercomputers frequently utilize an active backplane with routing components forming a communications mesh. Point-to-point interconnects are used between components on the backplane. FIG. 1 shows a typical prior art approach used in recently developed routers where the links between routers are double terminated; the driver 11 is matched to the impedance of the line $Z_0$, and the line 13 is parallel terminated using a Thevenin equivalent termination 15. The scheme shown in FIG. 1 is described in detail by E. Reese, et al., "A Phase-Tolerant 3.8GB/s Data-Communication Router for a Multiprocessor Supercomputer Backplane", IEEE Solid-State Circuits Conference, February 1994.

Two goals for future backplanes are to reduce the total number of wires, and remove the termination resistors from the board. One way to reduce the total number of wires is to run the I/O buffers faster than the core circuits of the routing component. For example, with the core of the routing component operating at 200 MHz, reducing the number of pins per port by half would mean that the I/O buffers would need to operate at 400 MHz. This would require two separate clocks for the component, and these clocks would need to be phase locked. Distributing a 400 MHz clock across a system consisting of several thousand processing nodes would not be a simple task. Synthesizing this clock on chip would prove equally challenging.

Another approach would be to increase the information density on the wires by using a form of multi-valued logic, rather than binary. This would be attractive if the latency incurred as a result of encoding and decoding is not excessive, the signal to noise ratio is not degraded, and the gain bandwidth product of the input amplifier is sufficient to handle the smaller swings.

Neither of these approaches addresses the problem of the many on board termination resistors and their associated power consumption. Integration of the terminations on the die forming the integrated circuit would increase the size of the input cell, its corresponding pad capacitance, and the power it consumes. Incorporation of the resistors into the interconnect structure of either the board or the package is a possibility, if there is adequate room in the routing layers, and acceptable resistance tolerances can be achieved, but the power would be unchanged. Termination to a separate supply lowers the power, but the separate supply must be well decoupled in order to maintain a constant termination voltage with respect to the current return path of the driver when many outputs switch simultaneously.

SUMMARY OF THE INVENTION

The present invention utilizes a bidirectional scheme which allows bidirectional data communications over a single wire without using termination resistors by placing two drivers on the same wire, and allowing simultaneous data transfer in two directions. This doubles the effective bandwidth per pin without requiring a modification to the clocking scheme. The driver is impedance matched to the line, and used as the termination for the driver on the opposite end of the wire. This reduces the termination power, since no power is consumed when both drivers are in the same state. The bidirectional flow of data creates a ternary encoding, with a relatively simple decoding possible. Signal swing, and more importantly, signal-to-noise ratio is the same as for the unidirectional scheme used in the prior art.

Although bidirectional schemes for inter-chip communication are known, they require current mode signaling and explicit terminations as described in L. Dennison, et al., "High-Performance Bidirectional Signaling in VLSI", Proceedings of the Symposium on Integrated Systems, March 1993.

DETAILED DESCRIPTION OF THE INVENTION

A bidirectional signaling scheme is described with implicit termination. The invented bidirectional approach allows data transmission simultaneously in two directions over one wire. This doubles the effective bandwidth per pin over a point-to-point unidirectional scheme operating at the same frequency. The line termination is provided by the driver, eliminating discrete terminations from the board. When the drivers at both ends of the line are in the same state, no power is consumed during input/output (I/O) operations. This can result in significant power savings.

Figure 1:
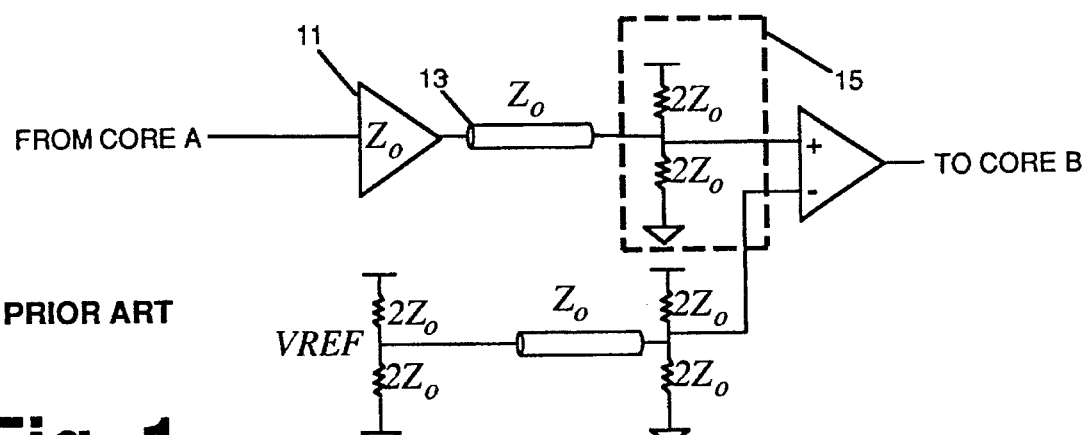
FIG. 1 is a schematic diagram of a prior art unidirectional link.
Figure 2:
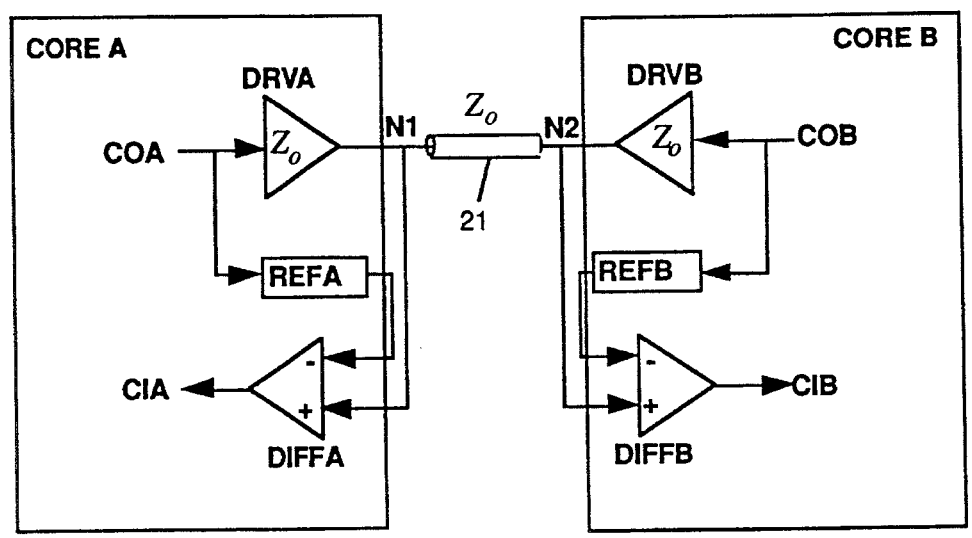
FIG. 2 is a block overview diagram showing the implementation of a bidirectional signaling scheme according to the present invention.

A conceptual version of the bidirectional signaling scheme using a single wire 21 is shown in FIG. 2.

COA, COB and CIA, CIB are signals from and to the core of two components (core A and core B) in the system respectively. REFA and REFB are reference generators for core A and core B respectively used to dynamically set the threshold of the receivers according to the present state of the outgoing data. REFA and REFB subtract the outputs from core A and core B respectively so that only the output from core B is seen by the input to core A and only the output from core A is seen by the input to core B. DIFFA and DIFFB are differential amplifiers driving to core A and core B respectively. DRVA and DRVB, which are drivers from core A and core B respectively, form a voltage divider that creates the states shown in Table 1:

TABLE 1

| | | Possible States | | |
|---|---|---|---|---|
| COA | COB | REFA | REFB | LINE 21 |
| 0 | 0 | 1/4 $V_{cc}$ | 1/4 $V_{cc}$ | $V_{ss}$ |
| 0 | 1 | 1/4 $V_{cc}$ | 3/4 $V_{cc}$ | 1/2 $V_{cc}$ |
| 1 | 0 | 3/4 $V_{cc}$ | 1/4 $V_{cc}$ | 1/2 $V_{cc}$ |
| 1 | 1 | 3/4 $V_{cc}$ | 3/4 $V_{cc}$ | $V_{cc}$ |

This is a ternary encoding in which there is a one-to-one correspondence between two of the binary states (i.e., COA, COB=0,0 or COA, COB=1,1) and two of the ternary states (i.e., $V_{SS}$ and $V_{CC}$). The remaining two binary states (i.e., COA, COB=0,1 or COA, COB=1,0) are mapped to a single ternary state (i.e., ½ $V_{CC}$). It is this state that creates the need for the adjustable references in order to decode the line voltage. The state of the signal being sent by the local driver is the information used to do the decode. As an example, assume that COB is in the low state. As COA switches between the high and low states, the line voltage moves between ½$V_{CC}$ and $V_{SS}$ respectively. REFA alternates between ¾$V_{CC}$ and ¼$V_{CC}$, while REFB is a constant ¼$V_{CC}$. Note that the line voltage is always lower than REFA, while DIFFB sees a signal with a ½$V_{CC}$ swing centered on a ¼$V_{CC}$ reference. CIA is, therefore, a constant zero, which reflects the state of COB, while CIB follows COA. REFA switching is used to keep CIA constant as the line voltage switches. With COB high, the results are analogous, except that the line alternates between $V_{CC}$ and ½$V_{CC}$, and REFB is ¾$V_{CC}$. The case where both drivers are switching is a direct extension of the above example with both REFA and REFB switching to correctly decode the line voltage at the receivers, i.e., DIFFA for driver DRVB and DIFFB for driver DRVA.

In the ideal case (a lossless line, both drivers matched to the line, and step function input signals at nodes N1 and N2), the presence of the transmission line 21 does not affect the decoding since the line is correctly terminated for signals traveling in both directions. The only effect of the line is a time shifting of the edges from and to nodes N1 and N2. In this ideal system, the only voltages seen on the line and at nodes N1 and N2 will be those shown in Table 1.

The peak-to-peak swing for the bidirectional case with a single driver switching is the same as for the unidirectional link case, ½$V_{CC}$. In the unidirectional case, this swing is between ¼$V_{CC}$ and ¾$V_{CC}$. This means that the on chip power in the driver is $$(¼V_{CC})^2/Z_o$$

In the bidirectional case, when the line is at either $V_{CC}$ or $V_{SS}$, no power is dissipated. When the line is at ½$V_{CC}$, the power consumed by the driver is $$(½V_{CC})^2/Z_o$$

If it is assumed that all states are equally likely, the power would be half this amount, since two out of four states dissipate no power. The total on chip power is then $$½(½V_{CC})^2/Z_o$$

which is double the power of the unidirectional case. The bidirectional case, however, dissipates no off chip termination power, while the Thevenin terminated, unidirectional case dissipates $$\{(¼V_{CC})^2+(¾V_{CC})^2\}/2Z_o$$

The total system power saved per pin in the bidirectional case is $$(½V_{CC})^2/Z_o$$

at a cost of $$(¼V_{CC})^2/Z_o$$

of additional on chip power dissipation. The total system power for the unidirectional case is double the power for the bidirectional case. The savings would be half the amount shown above if the unidirectional link were terminated to a rail, rather than a Thevenin termination, but still quite significant.

The signal swing of ½$V_{CC}$ with ¼$V_{CC}$ noise margin is the same for both the unidirectional and bidirectional cases. This is significant, since it means that the ternary encoding has cost nothing in terms of noise margin with respect to the unidirectional links. With an effective swing of ½$V_{CC}$, this also means that the noise generated on the links will, to first order, be equal. The signal to noise ratio has, therefore not been changed. This also means that the swing at the input receiver is unchanged, so that the receiver's gain does not need to be increased for the bidirectional case.

Circuit Implementation

The ideal bidirectional scheme of FIG. 2 is conceptually simple to implement. However, in actually implementing such a scheme, there are several circuit challenges to overcome. The discussion to this point has assumed that the drivers DRVA and DRVB and the reference generators REFA and REFB have equal delays. Any deviation from this assumption will result in jitter on CIA and CIB with respect to the clock used in the core of the component, since the inputs to the differential amplifiers DIFFA and DIFFB will not switch simultaneously when the local driver switches. If the delay difference is extreme (e.g., greater than ½ ns), glitches will appear on these nodes. One approach that may be used to attempt to alleviate this problem is to avoid switching the local driver and reference as incoming data edges arrive at the receiver. However, it has been determined that if the total jitter and skew of incoming data with respect to clock is greater than ¼ bit cell, switching of the drivers and references coincident with incoming edges can not be avoided on both ends of the wire simultaneously. It is unlikely that at the speeds being targeted (200 MHz+), the jitter and skew can be kept under ¼ bit cell. This being the case, the problem must be reduced to a minimum with careful circuit design and layout. An approach which addresses these issues will now be described with reference to FIG. 3 in which a reference control signal 23 or 25 from the pre-driver 27 or 29 of the output cell is used to control a multiplexor (31 and 33), which switches between reference levels input to each multiplexor based on the reference control signal (23 or 25). The reference control signals are each 0 or 1 and are equal to the value of the signal from their respective core, i.e. core A or core B. To implement REFA and REFB, the circuit portions indicated by reference numbers 35 and 37 are utilized where, $Z_1$ and $Z_2$ are chosen so that:

$$Z_1 \| Z_2 = Z_0$$

or $$\frac{Z_1 \times Z_2}{Z_1 + Z_2} = Z_0,$$

and $$V_{CC} * \left( \frac{Z_L}{Z_U + Z_L} \right) = V_{REF}$$

where $Z_U$ is the upper resistor of the pair and $Z_L$ is the lower resistor of the pair.

It should be noted that the use of two separate differential amplifiers per incoming pin, with one of the reference levels going to each, then multiplexing their outputs is not feasible due to problems in matching the two differential amplifiers and timing the multiplexor select.

The references 39 and 41 are generated on chip as follows. Two reference signals 39 and 41 (per data port consisting of several data signals) are generated on the chip and are connected between the two communicating ports. The logic state of the outgoing data dynamically selects which reference is used by the input amplifier. If the outgoing data is a logic low, then the (¼)VCC reference is selected, if the data is a logic high, then the (¾)VCC reference is used. Conceptually this technique subtracts outgoing data from the incoming data digitally, rather than in analog mode, reducing sensitivity to noise. Generating reference signals on the chip reduces common mode noise, and allows the reference levels to track any variations in driver impedance. In order to track most of the common mode noise between the two ports, the output impedance of the reference generator is closely matched to that of the driver. In fact, the reference is constructed using the driver, with both P and N transistors conducting to closely match the line impedance as described below with reference to FIG. 5. When switching the reference and local driver, it is important to match the paths from the pad and the predriver to the differential amplifier. Any mismatch between these paths adds to the jitter of the input signal relative to clock, and could cause glitches at the output of the differential amplifier.

The references 39 and 41 are connected bidirectionally in order to couple as much common mode noise as possible to the inputs of the differential amplifiers DIFFA and DIFFB, and to allow any variation in line voltage due to process variation to be tracked by the reference 39 and 41 (REFA and REFB). In order for this scheme to be effective, the impedance of the references 39 and 41 must be as close to that of the I/O buffers of the core as possible. The references 39 and 41 are built using an output driver with both the PMOS and NMOS devices on. The impedance of each of these devices is set such that the Thevenin equivalent circuit is a resistance of $Z_o$ to a power supply equal to the desired reference voltage.

Figure 3:
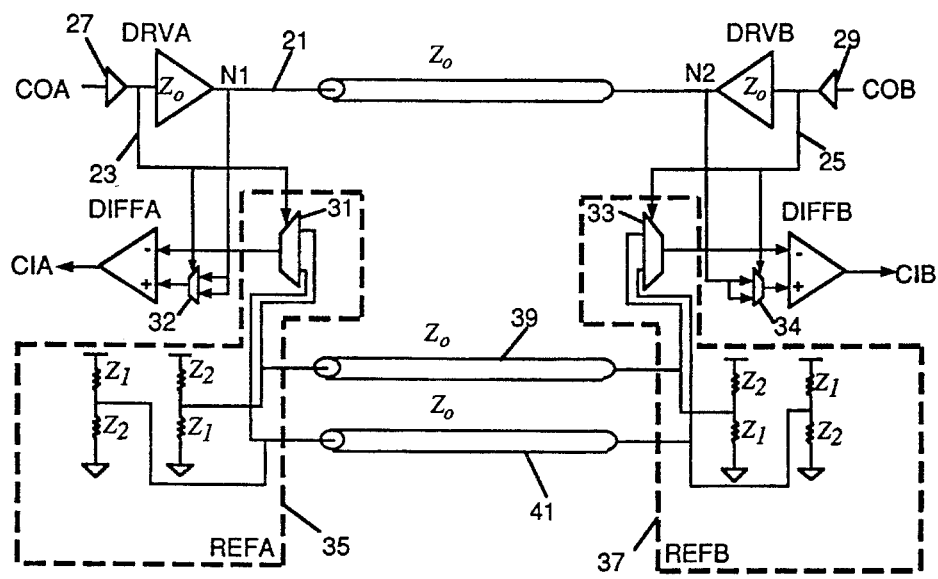
FIG. 3 is a detailed block diagram showing an implementation of a bidirectional signaling scheme according to the present invention.

Although FIG. 3 shows two references and a single data wire 21, it should be noted that only two references are needed (one for output logic low and one for output logic high) notwithstanding that there are multiple data wires, typically 16, connecting the two component cores. In this connection, it should be noted that only two references are needed regardless of the number of data wires. However, for electrical performance reasons, more than two references may be employed for wider (32 bit or 64 bit) data paths.

Multiplexors 31 and 33 are each built as a pass gate structure. The parasitic diodes (not shown) associated with the multiplexor transistors (not shown) are also used for electrostatic discharge (ESD) protection. Multiplexors 32 and 34 are also inserted into the data path from N1 and N2 to the differential amplifiers DIFFA and DIFFB to ensure that the data and reference paths are matched as closely as possible.

Figure 4:
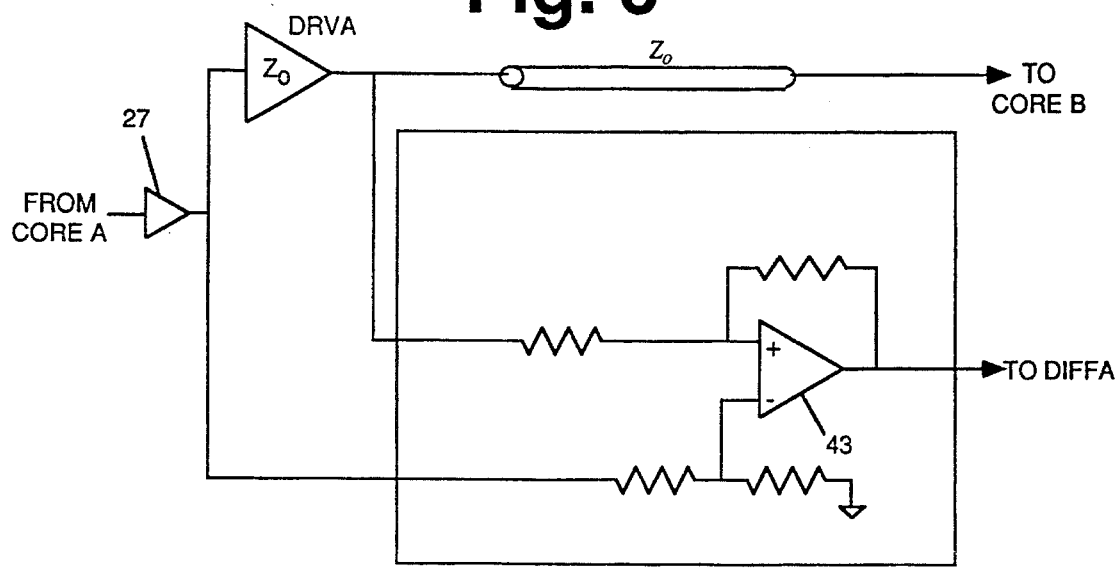
FIG. 4 is a circuit diagram showing an alternate embodiment of the reference circuits REFA and REFB.

FIG. 4 shows an alternate embodiment of a circuit implementing DRVA to subtract the outgoing wave from the line voltage using a differential amplifier. The circuit for DRVB would be identical. As shown in FIG. 4, the subtraction may be implemented using differential amplifier 43 as is well known in the art.

For unidirectional links, the impedance of the driver should be matched to the line carrying the signal to the other component so that reflections from discontinuities, and crosstalk from adjacent lines are correctly terminated. Since these terms are expected to be small, relatively large deviations from absolute matching can be tolerated. In the bidirectional scheme, the driver DRVA and DRVB must still perform these functions, but the driver is also used as the line termination. Matching driver impedance to the line 11 is much more critical in this case. The driver used is of the binary weighted, multi-leg variety as described below with reference to FIG. 5. The driver must be larger than in the unidirectional scheme since the impedance of the line must be matched at $½V_{CC}$ rather than $¼V_{CC}$ and the impedance of an MOS driver is non-linear. This style of driver allows the impedance to be varied to match that of the line. Impedance adjustment may be performed using a scan mechanism as is well known in the art.

Figure 5:
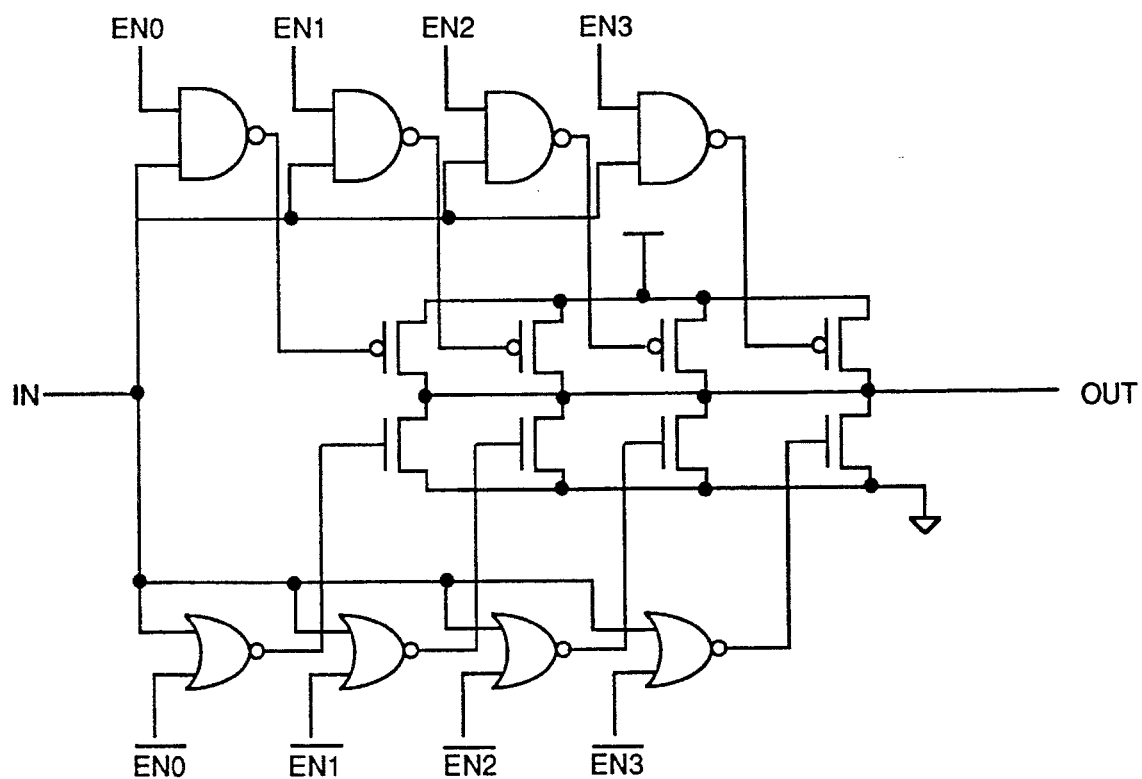
FIG. 5 is a circuit diagram of an driver with termination which may be utilized in the present invention.

FIG. 5 is a circuit diagram of a driver with termination which may be utilized in the present invention. The NAND gate, NOR gate and transistor gate arrays function as the termination set to an impedance of $Z_0$. The precise termination value is determined by the settings of EN0, EN1, EN2, EN3 and their inverses which are set when the board on which the chip utilizing the driver is being built so that the p and n transistors are conducting so as to closely match the line impedance. One way this can be accomplished is to use a chip scan chain using external scan data and control signals to set EN0, EN1, EN2, EN3 and their inverses to enable the correct number of legs of the transistors within box 61 as is well known in the art. This operation is performed one time and accounts for process variations but not voltage and temperature variations which may exist when the part is being used. Also, if scan is not needed for other purposes, the external pins needed for the scan data and control signals are wasted since they are used for only this one function. An alternate approach is to use an external resistor which is input to a state machine which provides the EN0, EN1, EN2, EN3 signals and their inverses This approach uses just one external pin and a well behaved resistor which allows for temperature and voltage variations to be compensated for. The specifics for implementing a suitable state machine and resistor should be readily apparent to persons skilled in the art.

Figure 6:
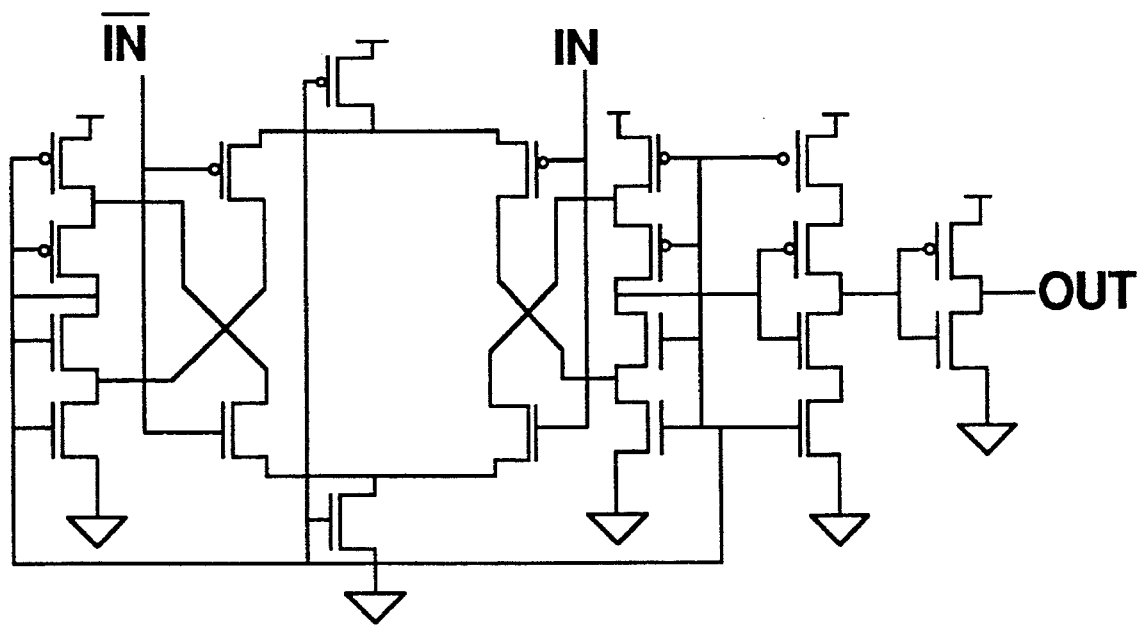
FIG. 6 is a circuit diagram of a differential amplifier which may be utilized in conjunction with the present invention.

A major consideration for the input differential amplifiers (DIFFA and DIFFB) is the common mode range. While the amount of signal swing for both bidirectional and unidirectional links is equivalent, the common mode levels are quite different. In the unidirectional case, with no noise, the common mode level is $\frac{1}{2}V_{CC}$. In the bidirectional case, the common mode level varies between $\frac{1}{8}V_{CC}$ and $\frac{7}{8}V_{CC}$. Once noise is factored in, the differential amplifier must have rail to rail common mode range. It must also be a relatively simple, low power structure, since there will be about 120 inputs on a typical routing component utilizing the technology. The circuit chosen to implement the differential amplifier DIFFA and DIFFB is of the self biased, large common mode range variety described in M. Bazes, "Two Novel Fully Complementary Self-Biased CMOS Differential Amplifiers", IEEE Journal of Solid-State Circuits, vol. 26, February 1991 and U.S. Pat. No. 4,958,133 which issued Sep. 18, 1990 entitled "CMOS Complementary Self-Biased Differential Amplifier with Rail-To-Rail Common Mode Input Voltage Range." This circuit is symmetric, requires no separate bias generator, and the negative feedback built into the self biasing scheme helps make the amplifier insensitive to process, temperature, and $V_{CC}$ variations. The circuit is shown in FIG. 6.

A bidirectional signaling scheme has been described which allows simultaneous transmission of data in two directions on the same wire. The scheme is self terminating, so that no explicit terminations are required to properly terminate a transmission line. This scheme implements a ternary encoding with signal swings and signal to noise ratios equal to those which could be achieved on a double terminated unidirectional link. Since no external termination resistors are required, and no power is dissipated when the drivers on both ends of the wire are in the same state, the system I/O power requirement is ½ that of a Thevenin terminated, unidirectional link. Use of this scheme with no modification of the component clock frequency would reduce the required number of I/O pins to half the number required for unidirectional links. The scheme is generally applicable to any chip-to-chip link that can be implemented in a point-to-point fashion.

Although the description references two component cores communicating with each other, persons skilled in the art will recognize that the inventive principles has application to systems with more than two component cores where each core is one element of an N by M matrix, with core communicating to an adjacent core over a single wire for each signal such that each core can have up to an arbitrary number of adjacent cores.

Figure 7:
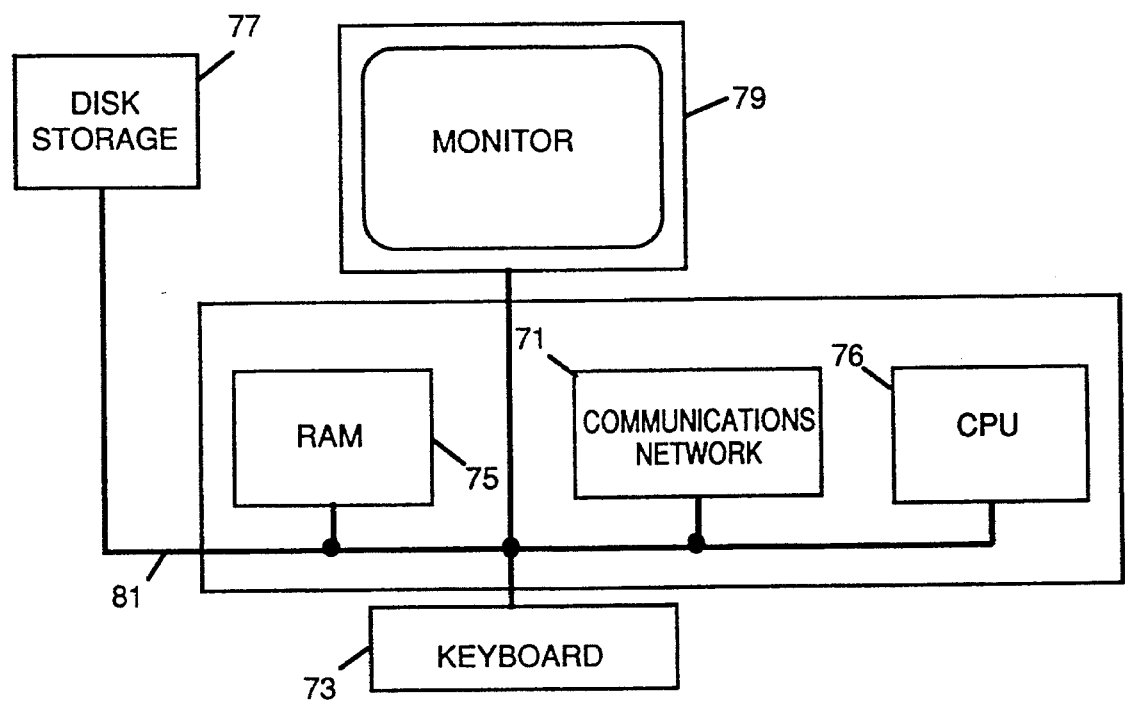
FIG. 7 is a block diagram of a multiprocessor computer system which may utilize the invented bidirectional signaling scheme.

Of course, an entire system of multiple components communicating with each other as described herein can be a subsystem of larger computer system as shown in FIG. 7 which includes in addition to communications network 71 of the type described herein, a data entry device such as a keyboard 73, internal memory such as RAM 75, CPU 76, external memory such as disk 77 and display device such as monitor 79, all interconnected by bus 81. The details for implementing a system of the type shown in FIG. 7 are well known to persons skilled in the art.

We claim:

1. In a system utilizing at least two component cores, a circuit for bidirectionally transferring a signal from one of said cores to the other of said cores comprising:

a) a first driver of a first one of said component cores coupled to a data line;

b) a second driver of a second one of said component cores coupled to said data line;

c) first and second reference means for generating first and second reference levels, respectively, wherein each of said first and second reference means inputs a reference control signal corresponding to an output of the component core to which it is coupled, said reference control signal being used to select one of said first and second reference levels;

d) first and second differential amplifier means, each having as a first input a selected one of said first and second reference levels and each having as a second input a signal on said data line for generating a difference signal.

2. The system defined by claim 1 wherein each of said first and second reference means comprises a multiplexor which utilizes said reference control signal to select one of said first and second reference levels wherein said reference levels correspond to a digital subtraction of outgoing data from said component core from data incoming to said component core.

3. The system defined by claim 1 wherein each of said first and second reference means comprises:

a) a first pair of resistances coupled in series between VCC and VSS to form an impedance equal to a resistance formed by a first reference line coupled to two of said component cores;

b) a second pair of resistances coupled in series between VCC and VSS to form an impedance equal to a resistance formed by a second reference line to said two of said component cores.

4. The system defined by claim 1 wherein each of said first and second reference means comprises a differential amplifier having as one input said data line and having as a second input an output from its corresponding driver.

5. The system defined by claim 1 wherein each of said first and second drivers is implemented as a binary weighted, multi-leg driver.

6. The system defined by claim 1 wherein each of said first and second differential amplifier means comprises a self biased, large common mode range differential amplifier.

7. A computer system including memory, a CPU and a communications network coupled to said memory and said CPU wherein said communications network includes a plurality of component cores coupled to each other with data lines, each of said component cores comprising:

a) a driver coupled to one of said data lines;

b) reference means coupled to an input to said driver for generating a reference level, wherein said reference means inputs a reference control signal corresponding to an output of the component core to which it is coupled, said reference control signal being used to select one of a first and a second reference level;

c) differential amplifier means having as a first input said selected reference level and having as a second input a signal on said data line for generating a difference signal.

8. The system defined by claim 7 wherein said reference means comprises a multiplexor which utilizes said reference control signal to select one of a first and a second reference level wherein said reference levels correspond to a digital subtraction of outgoing data from said component core from data incoming to said component core.

9. The system defined by claim 7 wherein said reference means comprises:

a) a first pair of resistances coupled in series between VCC and VSS to form an impedance equal to a resistance formed by a first reference line coupled between a pair of said component cores;

b) a second pair of resistances coupled in series between VCC and VSS to form an impedance equal to a resistance formed by a second reference line coupled between said pair component cores.

10. The system defined by claim 7 wherein said reference means comprises a differential amplifier having as one input one of said data lines and having as a second input an output from its corresponding driver.

11. The system defined by claim 7 wherein said driver is implemented as a binary weighted, multi-leg driver.

12. The system defined by claim 7 wherein said differential amplifier means comprises a self biased, large common mode range differential amplifier.

13. A computer system including memory, a CPU and a communications network coupled to said memory and said CPU wherein said communications network includes a plurality of component cores coupled to each other with data lines, each of said component cores comprising:

a) a driver coupled to one of said data lines;

b) reference means coupled to an input to said driver for generating a reference level, wherein said reference means inputs a reference control signal corresponding to an output of the component core to which it is coupled and comprises a multiplexor which utilizes said reference control signal to select one of a pair of reference levels wherein said reference levels correspond to a digital subtraction of outgoing data from said component core from data incoming to said component core;

c) differential amplifier means having as a first input said reference level and having as a second input a signal on said data line for generating a difference signal.

14. The system defined by claim 13 wherein said reference means comprises:

a) a first pair of resistances coupled in series between VCC and VSS to form an impedance equal to a resistance formed by a first reference line coupled between a pair of said component cores;

b) a second pair of resistances coupled in series between VCC and VSS to form an impedance equal to a resistance formed by a second reference line coupled between said pair component cores.

15. The system defined by claim 13 wherein said reference means comprises a differential amplifier having as one input one of said data lines and having as a second input an output from its corresponding driver.

16. In a computer system including memory, a CPU and a communications network coupled to said memory and said CPU wherein said communications network includes a plurality of component cores coupled to each other with data lines, a method for transmitting data bidirectionally over a single data line comprising the steps of:

a) coupling a driver to one of said data lines;

b) generating a reference level based on an input to said driver, said reference level corresponding to a selected one of a pair of reference levels;

c) generating a difference signal between said reference level and a signal on said data line.

17. A method for bidirectionally transferring a signal between at least two component cores comprising the steps of:

a) coupling a first driver of a first one of said component cores to a data line;

b) coupling a second driver of a second one of said component cores to said data line;

c) generating first and second reference levels for each of said component cores;

d) generating a difference signal for each of said component cores using first and second differential amplifiers, each having as a first input a selected one of said first and second reference levels and each having as a second input a signal on said data line;

wherein said first driver provides an implicit termination for said second driver and said second driver provides an implicit termination for said first driver.

* * * * *